United States Patent
Dogru et al.

(10) Patent No.: US 11,840,927 B2
(45) Date of Patent: Dec. 12, 2023

(54) METHODS AND SYSTEMS FOR GAS CONDENSATE WELL PERFORMANCE PREDICTION

(71) Applicant: SAUDI ARABIAN OIL COMPANY, Dhahran (SA)

(72) Inventors: Ali Haydar Dogru, Dhahran (SA); Xiang Yang Ding, Dhahran (SA)

(73) Assignee: SAUDI ARABIAN OIL COMPANY, Dhahran (SA)

(*) Notice: Subject to any disclaimer, the term of this patent is extended or adjusted under 35 U.S.C. 154(b) by 554 days.

(21) Appl. No.: 17/025,167

(22) Filed: Sep. 18, 2020

(65) Prior Publication Data

US 2022/0090496 A1 Mar. 24, 2022

(51) Int. Cl.
*G01V 99/00* (2009.01)
*G06F 30/20* (2020.01)
*E21B 49/08* (2006.01)
*E21B 43/00* (2006.01)

(52) U.S. Cl.
CPC ............ *E21B 49/08* (2013.01); *G01V 99/005* (2013.01); *G06F 30/20* (2020.01); *E21B 43/00* (2013.01); *E21B 2200/20* (2020.05)

(58) Field of Classification Search
CPC ...... E21B 49/08; E21B 2200/20; E21B 43/00; G06F 30/20; G01V 99/005
USPC .......................................................... 703/10
See application file for complete search history.

(56) References Cited

U.S. PATENT DOCUMENTS

| | | | |
|---|---|---|---|
| 10,082,602 B2 | 9/2018 | Siddiqui et al. | |
| 2005/0216198 A1* | 9/2005 | Craig | E21B 49/008 702/12 |
| 2009/0070086 A1 | 3/2009 | Le Ravalec et al. | |
| 2009/0204328 A1 | 8/2009 | Stewart | |

(Continued)

FOREIGN PATENT DOCUMENTS

| | | |
|---|---|---|
| CN | 108197366 A | 6/2018 |
| CN | 109543871 A | 3/2019 |

(Continued)

OTHER PUBLICATIONS

Fevang, Øivind, and Curtis H. Whitson. "Modeling gas-condensate well deliverability." SPE Reservoir Engineering 11.04 (1996). pp. 221-230. (Year: 1996).*

(Continued)

*Primary Examiner* — John E Johansen
(74) *Attorney, Agent, or Firm* — Osha Bergman Watanabe & Burton LLP

(57) ABSTRACT

A method may include determining, during a first time step within an iterative simulation process, various pseudo-pressure values based on model data. The method may include determining, during the first time step, a first set of skin factor values for the wellbore radial grid portions using the pseudo-pressure values. The method may include simulating, during the first time step, a first well production rate for a well within a reservoir region of interest using the first set of skin factor values and a first pressure distribution for the reservoir region of interest. The method may include simulating, during a second time step within the iterative simulation process, a second well production rate for the well using a second set of skin factor values and a second pressure distribution for the reservoir region of interest.

13 Claims, 9 Drawing Sheets

(56) References Cited

U.S. PATENT DOCUMENTS

| | | |
|---|---|---|
| 2009/0276156 A1 | 11/2009 | Kragas et al. |
| 2011/0155369 A1 | 6/2011 | Badazhkov et al. |
| 2014/0136112 A1 | 5/2014 | Al-Shawaf |
| 2014/0236557 A1 | 8/2014 | Likanapaisal |
| 2015/0227648 A1 | 8/2015 | Adeniji et al. |
| 2018/0308034 A1 | 10/2018 | Madasu et al. |

FOREIGN PATENT DOCUMENTS

| | | |
|---|---|---|
| CN | 110245454 A | 9/2019 |
| RU | 2476670 C1 | 2/2013 |
| RU | 2658422 C1 | 6/2018 |
| WO | 2016192077 A1 | 12/2016 |

OTHER PUBLICATIONS

Singh, Kameshwar and Curtis H. Whitson, "Gas Condensate Pseudopressure in Layered Reservoirs", SPE 117930, Society of Petroleum Engineers, Nov. 2008 (14 pages).

"Gas Condensate" Apr. 21, 2021; Retrieved from the Internet: URL: <https://www.sciencedirect.com/topics/earth-and-planetary-sciences/gas-condensate> (14 pages).

"Pseudopressure", Apr. 21, 2021; Retrieved from the Internet: URL: <https://www.sciencedirect.com/topics/engineering/pseudopressure> (14 pages).

"GigaPOWERS", Apr. 21, 2021; Retrieved from the internet: URL: <https://www.petromehras.com/petroleum-software-directory/reservoir-simulation-software/dynamic-simulation-software/gigapowers> (2 pages).

B.C. Craft et al., "Applied Petroleum Reservoir Engineering", Second Edition, Jan. 28, 1991; pp. 253-260 (5 pages).

S. Zhang et al, "Development of accurate well models for numerical reservoir simulation", Advances in Geo-Energy Research; Jun. 6, 2019; pp. 250-257 (8 pages).

International Search Report and Written Opinion issued in Application No. PCT/US2021/050893, dated Feb. 1, 2022 (17 pages).

Fevang et al.; "Modeling Gas Condensate Well Deliverability", SPE 30714; Society of Petroleum Engineers; Oct. 1995; pp. 1-16 (16 pages).

Shi et al.; "Production forecasting of gas condensate well considering fluid phase behavior in the reservoir and wellbore", Journal of Natural Gas Science and Engineering; vol. 24; Apr. 4, 2015; pp. 279-290 (12 pages).

Rahimzadeh et al.; "Condensate blockage study in gas condensate resevoir", Journal of Natural Gas Science and Engineering; vol. 33; May 24, 2016; pp. 634-643 (10 pages).

* cited by examiner

METHODS AND SYSTEMS FOR GAS CONDENSATE WELL PERFORMANCE PREDICTION

BACKGROUND

In simulations, properties for various cells may be averaged to produce a coarse grid. However, if not applied properly, averaging may provide a solution in a model that may lose accuracy as the details are lost in the process, especially where averaging is applied to highly influential grid-cells. Thus, accurate simulations may require a model that reduces the computational time to a reasonable speed while also preserving relevant physical relationships in the underlying data.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to a method that includes obtaining, by a computer processor, a coarse grid model including various wellbore radial grid portions and model data for a reservoir region of interest. The method may further determine, by the computer processor and during a first time step within an iterative simulation process, various pseudo-pressure values based on the model data. The method may further determine, by the computer processor and during the first time step, a first set of skin factor values for the wellbore radial grid portions using the pseudo-pressure values. The first set of skin factor values may correspond to gas mobility within the reservoir region of interest. The method may further simulate, by the computer processor and during the first time step, a first well production rate for a well within the reservoir region of interest using the first set of skin factor values and a first pressure distribution for the reservoir region of interest. The method may further simulate, by the computer processor and during a second time step within the iterative simulation process, a second well production rate for the well using a second set of skin factor values and a second pressure distribution for the reservoir region of interest.

In general, in one aspect, embodiments relate to a system that includes a wellhead coupled to a wellbore and a wellhead sensor coupled to the wellhead, and a reservoir simulator including a computer processor coupled to the wellhead sensor. The reservoir simulator obtains a coarse grid model including various wellbore radial grid portions and reservoir property data for a reservoir region of interest. The reservoir property data is acquired from the wellhead sensor. The reservoir simulator further determines, during a first time step within an iterative simulation process, various pseudo-pressure values based on the reservoir property data. The reservoir simulator further determines, during the first time step, a first set of skin factor values for the wellbore radial grid portions using the pseudo-pressure values. The first set of skin factor values correspond to gas mobility within the reservoir region of interest. The reservoir simulator further simulates, during the first time step, a first well production rate for a well within the reservoir region of interest using the first set of skin factor values and a first pressure distribution for the reservoir region of interest. The reservoir simulator further simulates, during a second time step within the iterative simulation process, a second well production rate for the well using a second set of skin factor values and a second pressure distribution for the reservoir region of interest.

In general, in one aspect, embodiments relate to a non-transitory computer readable medium storing instructions executable by a computer processor. The instructions obtain a coarse grid model including various wellbore radial grid portions and model data for a reservoir region of interest. The instructions determine, during a first time step within an iterative simulation process, various pseudo-pressure values based on the model data. The instructions determine, during the first time step, a first set of skin factor values for the wellbore radial grid portions using the pseudo-pressure values. The first set of skin factor values correspond to gas mobility within the reservoir region of interest. The instructions simulate, during the first time step, a first well production rate for a well within the reservoir region of interest using the first set of skin factor values and a first pressure distribution for the reservoir region of interest. The instructions simulate, during a second time step within the iterative simulation process, a second well production rate for the well using a second set of skin factor values and a second pressure distribution for the reservoir region of interest.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

Figure 1:
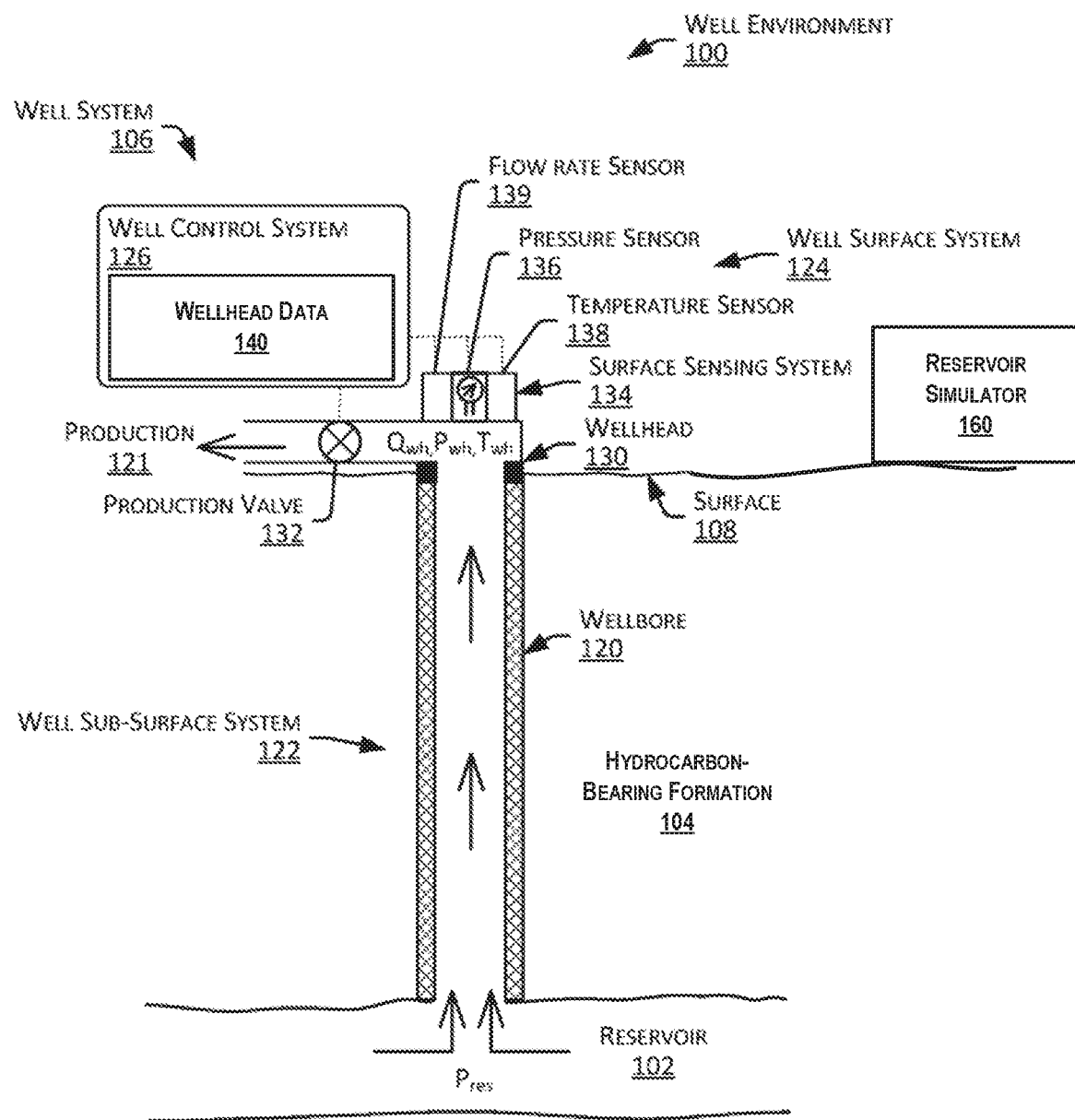
FIGS. 1, 2A, and 2B show systems in accordance with one or more embodiments.

In the following detailed description of embodiments of the disclosure, numerous specific details are set forth in order to provide a more thorough understanding of the disclosure. However, it will be apparent that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for simulating a hydrocarbon-bearing reservoir. In particular, some embodiments are directed to performing reservoir simulations for a gas condensate reservoir. For example, a gas condensate reservoir may have hydrocarbon deposits that are primarily a gas-phase hydrocarbon (i.e., "natural-gas") at an initial reservoir pressure. When natural-gas production begins from a production well, the reservoir pressure decreases faster near the wellbore than at distances away from the wellbore. The lower pressure around a wellbore may cause liquid phase hydrocarbon (i.e., "oil") to condense from the natural-gas, and accumulate in a region around the wellbore, called the oil condensation zone.

As oil may be less mobile than gas, oil may have greater difficulty flowing through rock pores. Furthermore, a buildup of condensed oil in a region near a wellbore may also block paths for gas through the rock pores. In this way, the condensed oil may act as a "skin effect" around the wellbore reducing the rate of natural-gas production. This skin effect may be quantified by a "skin factor" which may be used when simulating a gas condensate reservoir. Thus, the reservoir pressure around a wellbore changes over time as production of natural-gas proceeds at a production well. As such, the skin factor may also change over time, thereby making the skin factor dynamic within a reservoir simulation.

Some embodiments are directed to an iterative simulation process that calculates a new skin factor at a respective time step. Based on the physics of the fluid flow calculations in a particular time step, the current skin factor may be determined in order to predict a physically proper gas production rate at a simulated well. In contrast, other reservoir simulators may use a "fixed" skin factor, such that the skin factor corresponds to a real number that is constant and used to block or reduce gas flow in the reservoir simulation. However, this "fixed" skin factor may be unknown unless an extra field test is performed at a well. Likewise, as the skin factor changes with time during the life of a production well (e.g., usually the value increases but decreases in some situations). Therefore, in some embodiments, a reservoir simulator may adjust the skin factor during a simulation run using a wellbore radial grid and iteratively calculate the skin factor at each time step of the reservoir simulation. Such as reservoir simulations may determine natural-gas production rates as well as bottom-hole pressures for a given well.

Turning to FIG. 1, FIG. 1 shows a schematic diagram in accordance with one or more embodiments. As shown in FIG. 1, FIG. 1 illustrates a well environment (100) that includes a hydrocarbon reservoir ("reservoir") (102) located in a subsurface hydrocarbon-bearing formation ("formation") (104) and a well system (106). The hydrocarbon-bearing formation (104) may include a porous or fractured rock formation that resides underground, beneath the earth's surface ("surface") (108). In the case of the well system (106) being a hydrocarbon well, the reservoir (102) may include a portion of the hydrocarbon-bearing formation (104). The hydrocarbon-bearing formation (104) and the reservoir (102) may include different layers of rock having varying characteristics, such as varying degrees of permeability, porosity, and resistivity. In the case of the well system (106) being operated as a production well, the well system (106) may facilitate the extraction of hydrocarbons (or "production") from the reservoir (102).

In some embodiments, the well system (106) includes a wellbore (120), a well sub-surface system (122), a well surface system (124), and a well control system ("control system") (126). The control system (126) may control various operations of the well system (106), such as well production operations, well completion operations, well maintenance operations, and reservoir monitoring, assessment and development operations. In some embodiments, the control system (126) includes a computer that is the same as or similar to that of computer (702) described below in FIG. 7 and the accompanying description.

The wellbore (120) may include a bored hole that extends from the surface (108) into a target zone of the hydrocarbon-bearing formation (104), such as the reservoir (102). An upper end of the wellbore (120), terminating at or near the surface (108), may be referred to as the "up-hole" end of the wellbore (120), and a lower end of the wellbore, terminating in the hydrocarbon-bearing formation (104), may be referred to as the "down-hole" end of the wellbore (120). The wellbore (120) may facilitate the circulation of drilling fluids during drilling operations, the flow of hydrocarbon production ("production") (121) (e.g., oil and gas) from the reservoir (102) to the surface (108) during production operations, the injection of substances (e.g., water) into the hydrocarbon-bearing formation (104) or the reservoir (102) during injection operations, or the communication of monitoring devices (e.g., logging tools) into the hydrocarbon-bearing formation (104) or the reservoir (102) during monitoring operations (e.g., during in situ logging operations).

In some embodiments, during operation of the well system (106), the control system (126) collects and records wellhead data (140) for the well system (106). The wellhead data (140) may include, for example, a record of measurements of wellhead pressure ($P_{wh}$) (e.g., including flowing wellhead pressure), wellhead temperature ($T_{wh}$) (e.g., including flowing wellhead temperature), wellhead production rate ($Q_{wh}$) over some or all of the life of the well (106), and water cut data. In some embodiments, the measurements are recorded in real-time, and are available for review or use within seconds, minutes or hours of the condition being sensed (e.g., the measurements are available within 1 hour of the condition being sensed). In such an embodiment, the wellhead data (140) may be referred to as "real-time" wellhead data (140). Real-time wellhead data (140) may enable an operator of the well (106) to assess a relatively current state of the well system (106), and make real-time decisions regarding development of the well system (106) and the reservoir (102), such as on-demand adjustments in regulation of production flow from the well.

In some embodiments, the well surface system (124) includes a wellhead (130). The wellhead (130) may include a rigid structure installed at the "up-hole" end of the wellbore (120), at or near where the wellbore (120) terminates at the Earth's surface (108). The wellhead (130) may include structures for supporting (or "hanging") casing and production tubing extending into the wellbore (120). Production (121) may flow through the wellhead (130), after exiting the wellbore (120) and the well sub-surface system (122), including, for example, the casing and the production tubing. In some embodiments, the well surface system (124) includes flow regulating devices that are operable to control the flow of substances into and out of the wellbore (120). For example, the well surface system (124) may include one or more production valves (132) that are operable to control the flow of production (134). For example, a production valve (132) may be fully opened to enable unrestricted flow of production (121) from the wellbore (120), the production valve (132) may be partially opened to partially restrict (or "throttle") the flow of production (121) from the wellbore (120), and production valve (132) may be fully closed to fully restrict (or "block") the flow of production (121) from the wellbore (120), and through the well surface system (124).

Keeping with FIG. 1, in some embodiments, the well surface system (124) includes a surface sensing system (134). The surface sensing system (134) may include sensors for sensing characteristics of substances, including production (121), passing through or otherwise located in the well surface system (124). The characteristics may include, for example, pressure, temperature and flow rate of production (121) flowing through the wellhead (130), or other conduits of the well surface system (124), after exiting the wellbore (120).

In some embodiments, the surface sensing system (134) includes a surface pressure sensor (136) operable to sense the pressure of production (151) flowing through the well surface system (124), after it exits the wellbore (120). The surface pressure sensor (136) may include, for example, a wellhead pressure sensor that senses a pressure of production (121) flowing through or otherwise located in the wellhead (130). In some embodiments, the surface sensing system (134) includes a surface temperature sensor (138) operable to sense the temperature of production (151) flowing through the well surface system (124), after it exits the wellbore (120). The surface temperature sensor (138) may include, for example, a wellhead temperature sensor that senses a temperature of production (121) flowing through or otherwise located in the wellhead (130), referred to as "wellhead temperature" ($T_{wh}$). In some embodiments, the surface sensing system (134) includes a flow rate sensor (139) operable to sense the flow rate of production (151) flowing through the well surface system (124), after it exits the wellbore (120). The flow rate sensor (139) may include hardware that senses a flow rate of production (121) ($Q_{wh}$) passing through the wellhead (130).

In some embodiments, the well system (106) includes a reservoir simulator (160). For example, the reservoir simulator (160) may include hardware and/or software with functionality for generating one or more reservoir models regarding the hydrocarbon-bearing formation (104) and/or performing one or more reservoir simulations. For example, the reservoir simulator (160) may store well logs and data regarding core samples for performing simulations. A reservoir simulator may further analyze the well log data, the core sample data, seismic data, and/or other types of data to generate and/or update the one or more reservoir models. While the reservoir simulator (160) is shown at a well site, embodiments are contemplated where reservoir simulators are located away from well sites. In some embodiments, the reservoir simulator (160) may include a computer that is similar to the computer (702) described below with regard to FIG. 7 and the accompanying description.

Figure 2A:
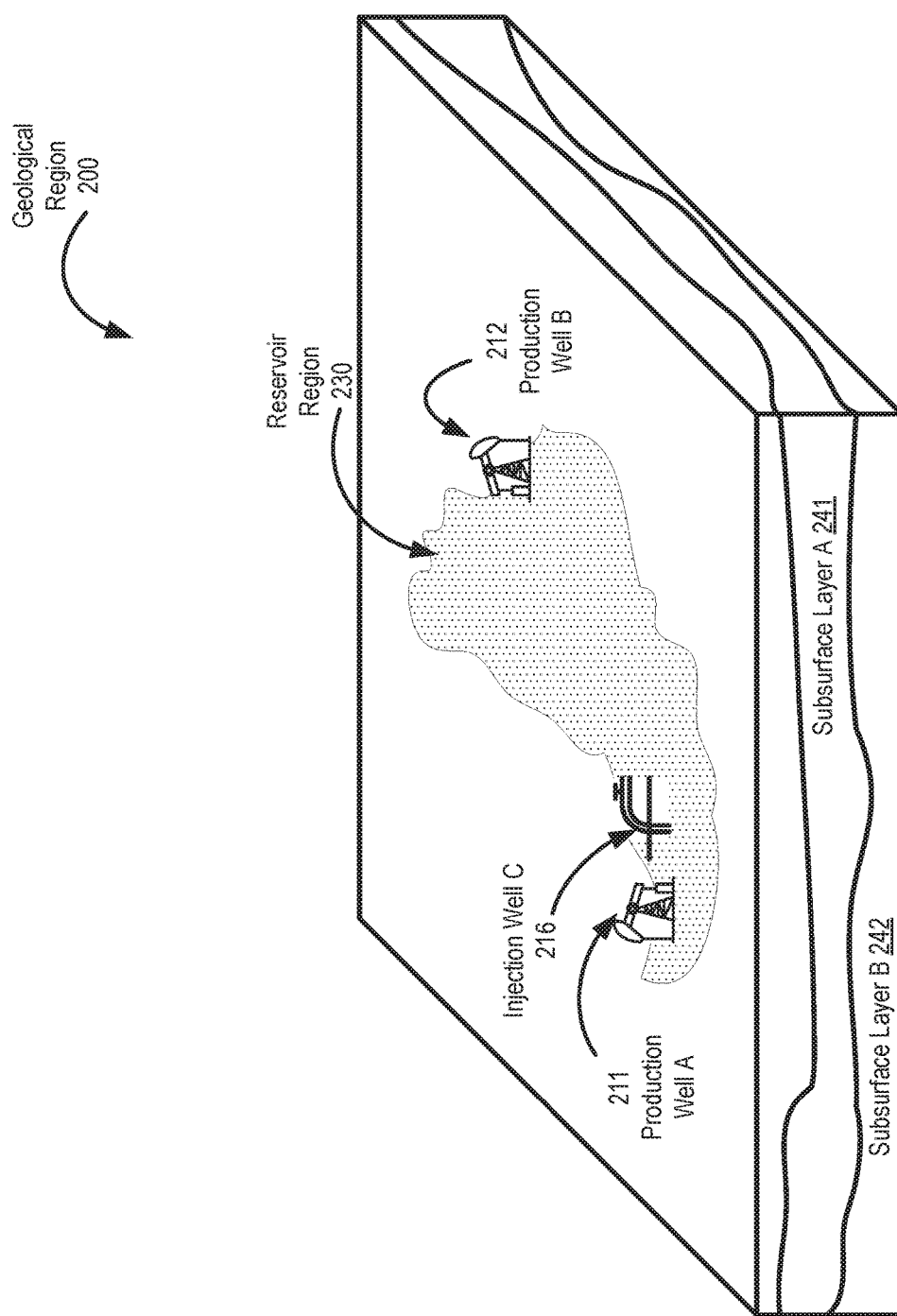

Turning to FIG. 2A, FIG. 2A shows a schematic diagram in accordance with one or more embodiments. As illustrated in FIG. 2A, FIG. 2A shows a geological region (200) that may include one or more reservoir regions (e.g., reservoir region (230)) with various production wells (e.g., production well A (211), production well (212)). For example, a production well may be similar to the well system (106) described above in FIG. 1 and the accompanying description. Likewise, a reservoir region may also include one or more injection wells (e.g., injection well C (216)) that include functionality for enhancing production by one or more neighboring production wells. As shown in FIG. 2A, wells may be disposed in the reservoir region (230) above various subsurface layers (e.g., subsurface layer A (241), subsurface layer B (242)), which may include hydrocarbon deposits. In particular, production data and/or injection data may exist for a particular well, where production data may include data that describes production or production operations at a well, such as wellhead data (142) described in FIG. 1 and the accompanying description.

Figure 2B:
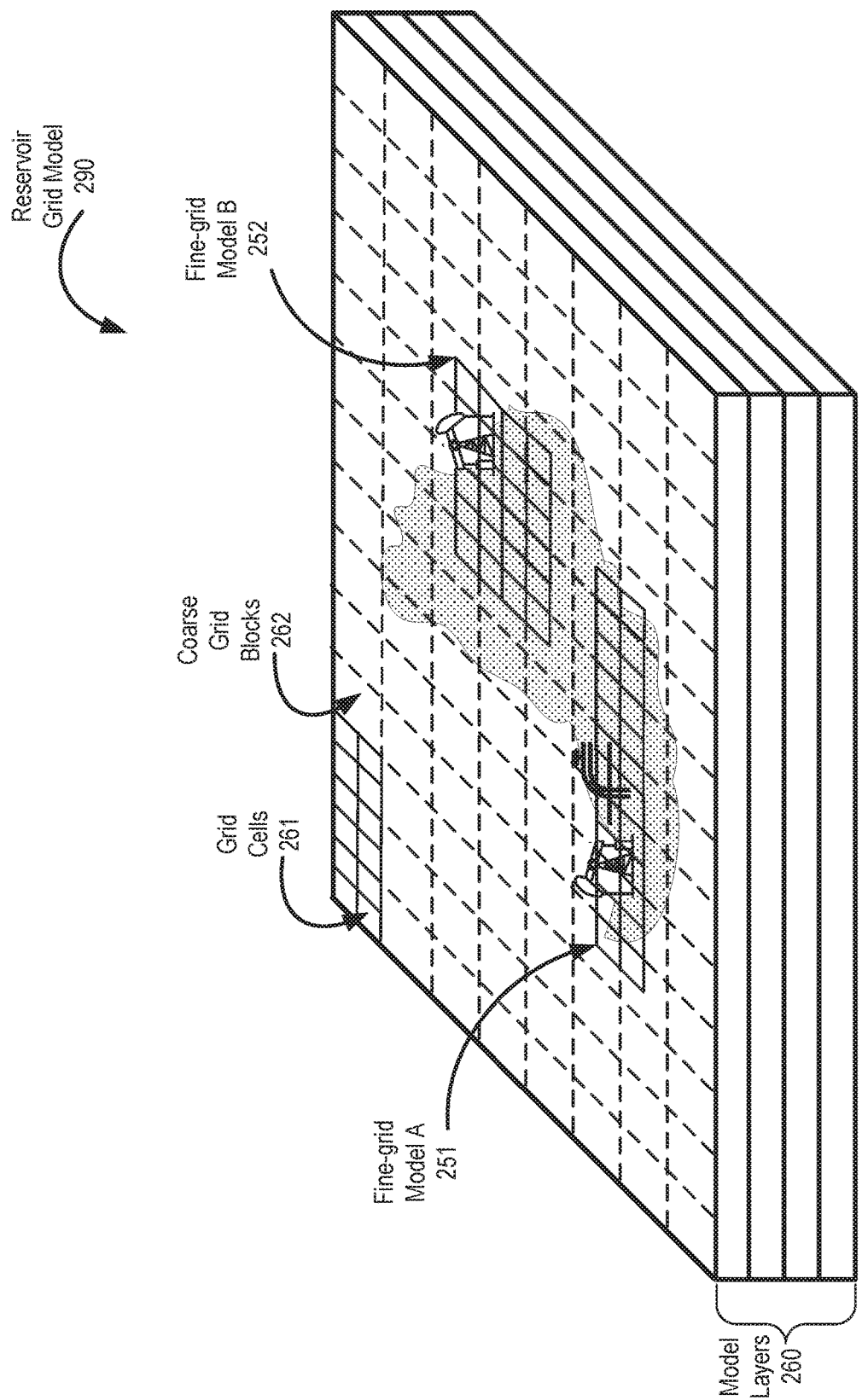

Turning to FIG. 2B, FIG. 2B shows a schematic diagram in accordance with one or more embodiments. As illustrated in FIG. 2B, FIG. 2B shows a reservoir grid model (290) that corresponds to the geological region (200) from FIG. 2A. More specifically, the reservoir grid model (290) includes grid cells (261) that may refer to an original cell of a reservoir grid model as well as coarse grid blocks (262) that may refer to an amalgamation of original cells of the reservoir grid model. For example, a grid cell may be the case of a 1×1 block, where coarse grid blocks may be of sizes 2×2, 4×4, 8×8, etc. Both the grid cells (261) and the coarse grid blocks (262) may correspond to columns for multiple model layers (260) within the reservoir grid model (290).

Prior to performing a reservoir simulation, local grid refinement and coarsening (LGR) may be used to increase or decrease grid resolution in a certain area of reservoir grid model. For example, various reservoir properties, e.g., permeability, porosity or saturations, may correspond to a discrete value that is associated with a particular grid cell or coarse grid block. However, by using discrete values to represent a portion of a geological region, a discretization error may occur in a reservoir simulation. Thus, finer grids may reduce discretization errors as the numerical approximation of a finer grid is closer to the exact solution, however through a higher computational cost. As shown in FIG. 2B, for example, the reservoir grid model (290) may include various fine-grid models (i.e., fine-grid model A (251), fine-grid model B (252)), that are surrounded by coarse block regions. Likewise, the original reservoir grid model without any coarsening may also be a fine-grid model.

In some embodiments, proxy models or reduced-order models may be generated for performing a reservoir simulation. For example, one way to reduce model dimensionality is to reduce the number of grid blocks and/or grid cells. By averaging reservoir properties into larger blocks while preserving the flow properties of a reservoir model, computational time of a reservoir simulation may be reduced. In general, coarsening may be applied to cells that do not contribute to a total flow within a reservoir region because a slight change on such reservoir properties may not affect the output of a simulation. Accordingly, different levels of coarsening may be used on different regions of the same reservoir model. As such, a coarsening ratio may correspond to a measure of coarsening efficiency, which may be defined as a total number of cells in a coarse reservoir model divided by the original number of cells in the original reservoir model.

Flow properties, such as flux, may be defined as a reservoir fluid (e.g., oil or natural-gas) that flows between any two grid blocks. Likewise, grid cells or blocks may be upscaled in a method that reduces the computational demand on running simulations using fewer grid cells. However, a grid model may lose accuracy in a reservoir simulation if the underlying properties differ too much from the original fine-grid model.

Figure 3A:
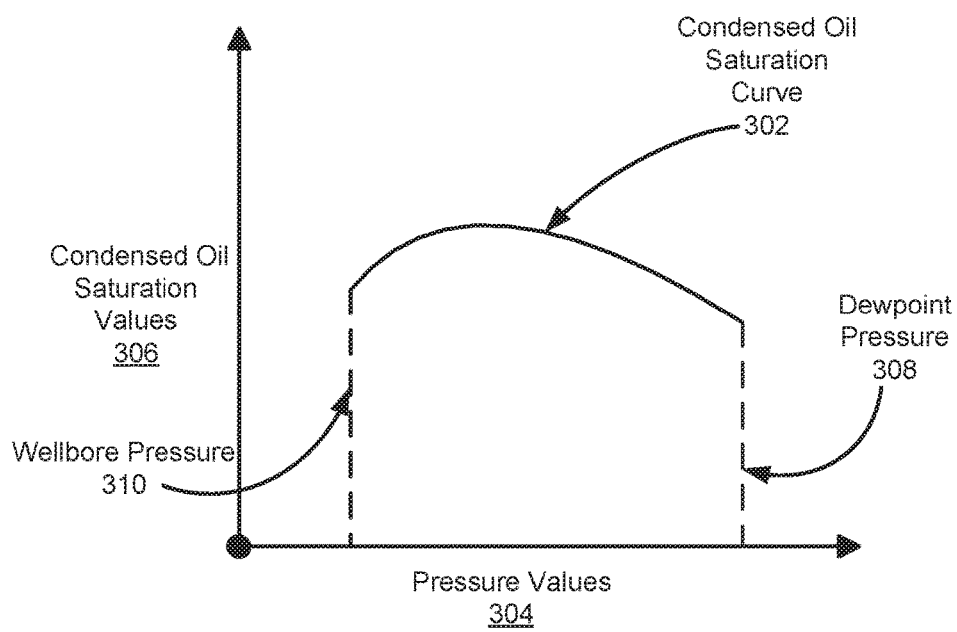
FIGS. 3A, 3B, 3C, and 3D show examples in accordance with one or more embodiments.

Turning to FIGS. 3A, 3B, 3C, and 3D, FIG. 3A shows a condensed oil saturation curve (302) in accordance with one or more embodiments. In particular, the condensed oil saturation curve (302) may describe a reservoir whose pores include natural-gas at initial reservoir pressures. In FIG. 3A, pressure values (304) are indicated on the horizontal axis and condensed oil saturation values (306) in the pores are indicated on the vertical axis. At initial reservoir pressures above the dewpoint pressure (308), the oil may be present in the pores as oil vapor in a similar manner as water vapor may be present in the air at the surface as a gas. At reservoir locations where the pressure falls below the dewpoint pressure (308), oil may condense from the oil vapor as a liquid. The condensed oil saturation value at a given pressure may be indicated by the condensed oil saturation curve (302).

Near a production well, the reservoir pressure may be reduced to a point close to the wellbore pressure (310) and well below the dewpoint pressure (308). This zone near a production well may be called the oil condensation zone and correspond to locations where oil condenses from gas. Condensed oil saturation levels in the oil condensation zone may be much larger than locations further from a production well, where the reservoir pressure is above the dewpoint pressure (308). This phenomenon may be depicted in FIG. 3B in accordance with one or more embodiments.

Figure 3B:
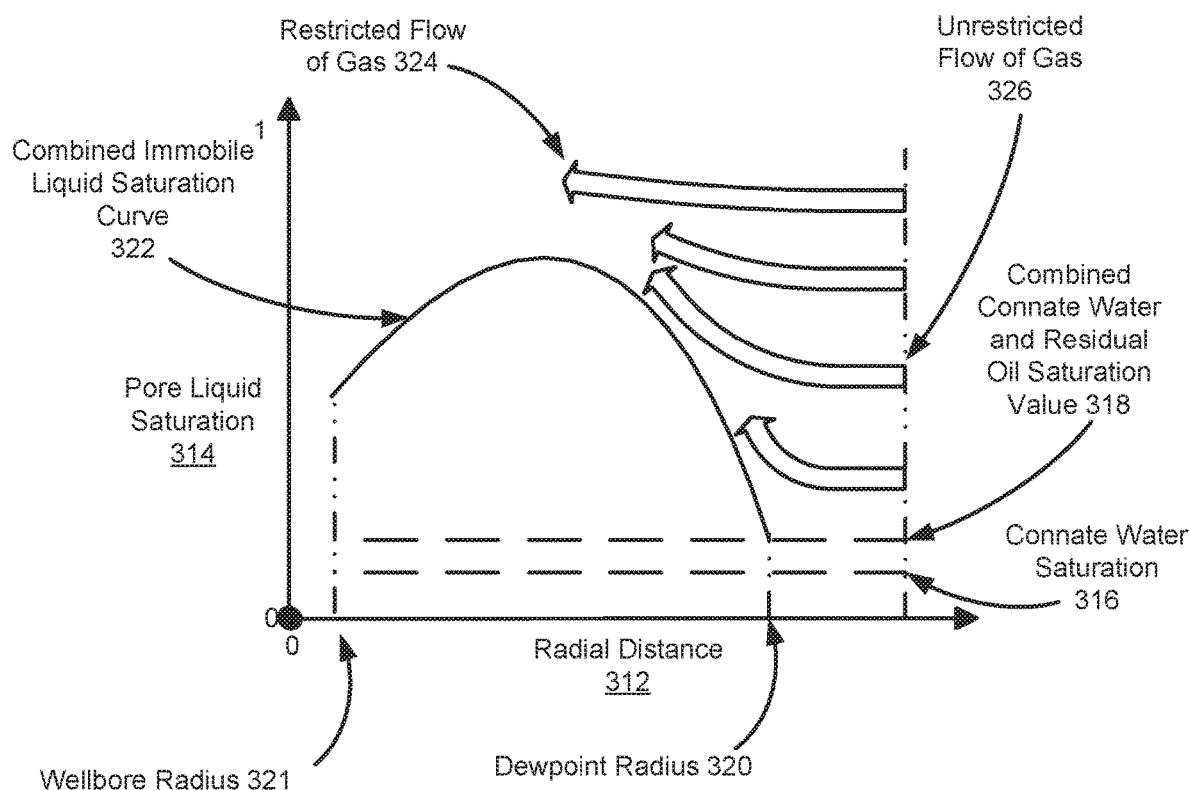

As illustrated in FIG. 3B, radial distance (312) away from a wellbore is shown on the horizontal axis and pore liquid saturation (314) is shown on the vertical axis. The liquid in the pores may be much less mobile than gas. The ease with which liquid flows through pores is quantified using a mobility index, as the liquid flows much less easily than gas when subject to the same reservoir pressure gradient. Thus, the gas mobility index may be much higher than a liquid mobility index or oil mobility index. The difference in mobility indices may be so great that liquid in the pores may be considered effectively immobile in comparison to gas in the pores for the purposes of reservoir simulation near a production well.

Keeping with FIG. 3B, connate water saturation (316) and residual oil may occur far from a production well in the pores of the reservoir. Residual oil and connate water may also be effectively immobile in comparison to gas in the pores for the purposes of a reservoir simulation. Regarding combined connate water and residual oil saturation value (318), this combined value may provide a base level of immobile pore liquids. At locations closer to the production well than the distance at which the reservoir pressure falls to the dewpoint pressure, additional oil may condense to increase the combined pore liquid saturation. The radial distance from a production well at which the reservoir pressure falls to the dewpoint pressure is referred to herein as the dewpoint radius (320). Closer to the production well than the dewpoint radius (320), the condensed oil described by the condensed oil saturation curve (302) adds to the combined connate water and residual oil saturation value (318) to increase the total pore liquid saturation in a manner indicated by a combined immobile liquid saturation curve (322). The immobile pore liquids occupy a portion of the pore space to produce a restricted flow of gas (324) through the reservoir to the production well that differs from an unrestricted flow of gas (326) far from the production well.

For the purposes of reservoir simulation, this restriction of the flow of gas in the vicinity of the production well may be thought of as similar to a semi-permeable "skin". Thus, the amount of the restriction of the flow of gas may be quantified by a factor termed the "skin factor". The value of this skin factor may change over time based on the historical production rate at a production well and "far-field" reservoir pressure changes. The far-field reservoir pressure may refer to the reservoir pressure at a distance sufficiently far from the production well to be effectively unaffected by the local effects of the production well.

Figure 3C:
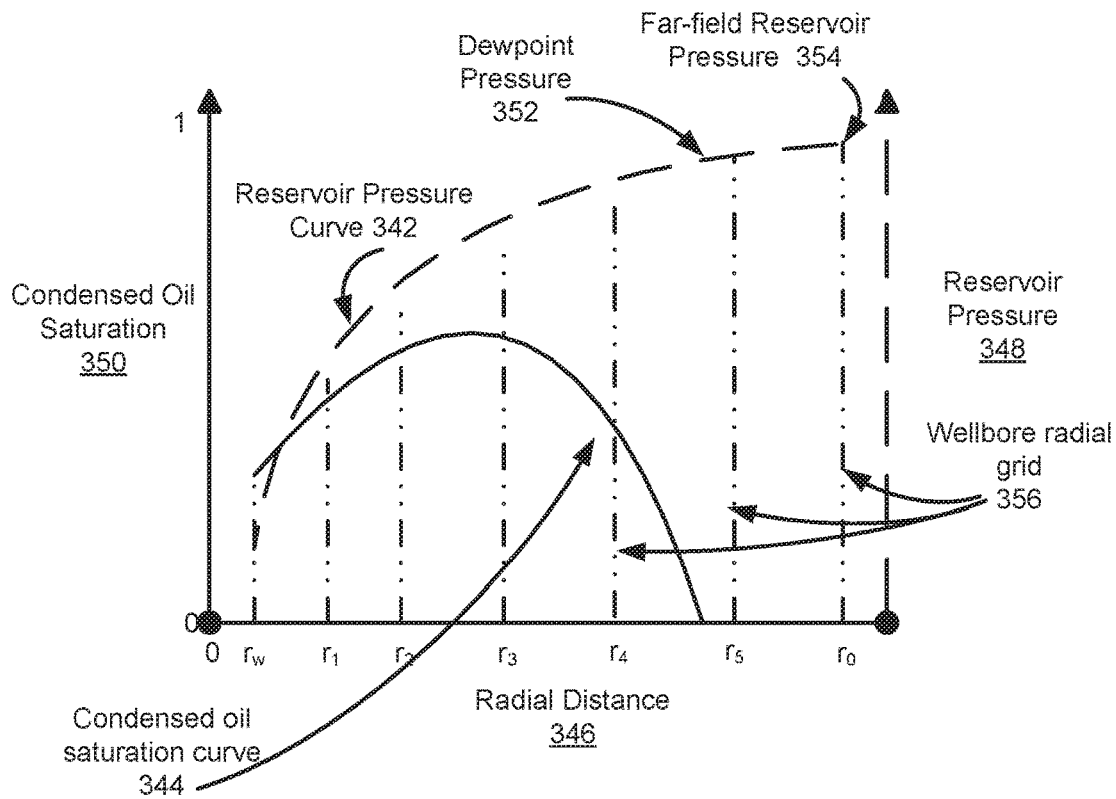

Turning to FIG. 3C, FIG. 3C depicts the variation of reservoir pressure (342) and the condensed oil saturation (344) based on radial distance (346) from a production well. The reservoir pressure (342) and condensed oil saturation (344) are different physical quantities with their values illustrated by the vertical axes on the right and on the left of FIG. 3C, respectively. Thus the vertical axis on the left indicates condensed oil saturation values (350), and the vertical axis on the right indicates reservoir pressure values (348). Additionally, FIG. 3C shows the dewpoint pressure (352) and the far-field reservoir pressure (354), described above.

In some embodiments the reservoir pressure curve (342) and condensed oil saturation curve (344) may be calculated by generating a wellbore radial grid (356) indicated by the dashed lines in FIG. 3C. In the embodiment shown in FIG. 3C, the wellbore radial grid has seven nodes, one at the wellbore radius, $r_w$, one at the exterior boundary of the wellbore radial grid, $r_O$ and five intermediate nodes, $r_n$, with n=1, ..., 5. However, in other embodiments the wellbore radial grid may have more, or fewer nodes, than seven. In various embodiments the wellbore radial grid nodes may be equally, or unequally, spaced in radial distance.

Figure 3D:
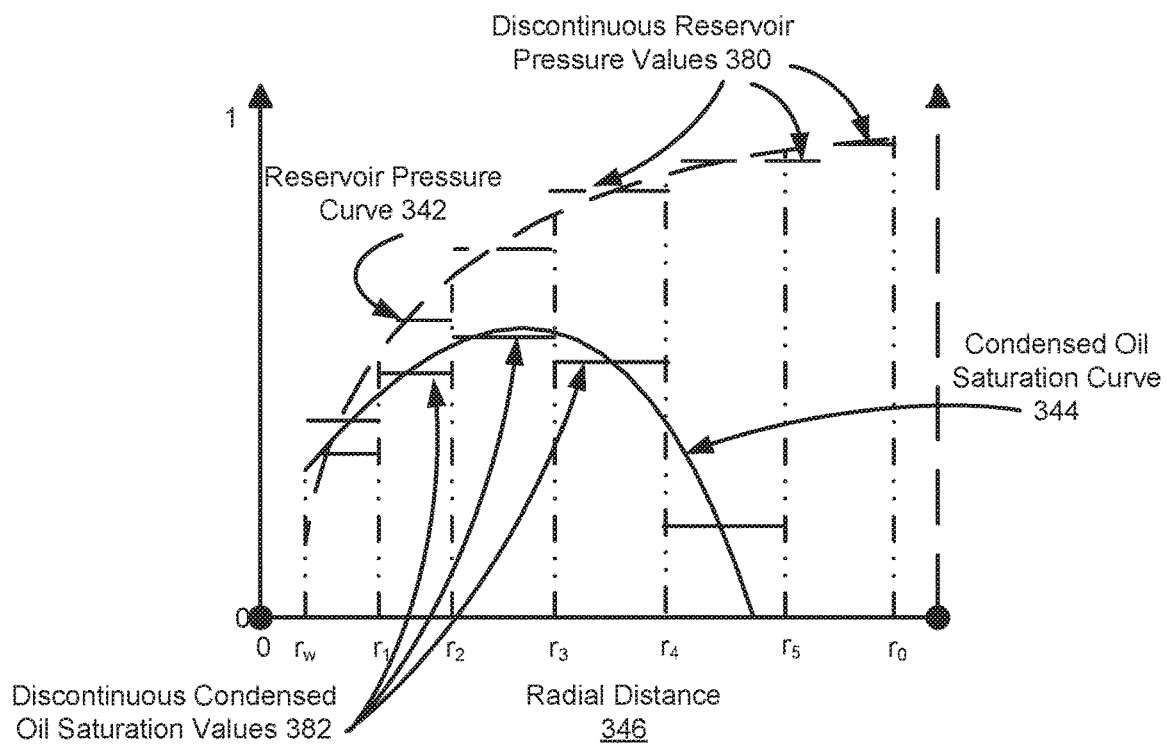

As shown in FIG. 3D, in some embodiments, the reservoir properties may approximate constant values within each portion of the wellbore radial grid. Thus, the continuous reservoir pressure curve (342) is approximated by a series of discontinuous reservoir pressure values (380) within each portion of the wellbore radial grid (356). Similarly, the continuous condensed oil saturation curve (344) is approximated by a series of discontinuous condensed oil saturation values (382) within each portion of the wellbore radial grid (356).

Figure 4:
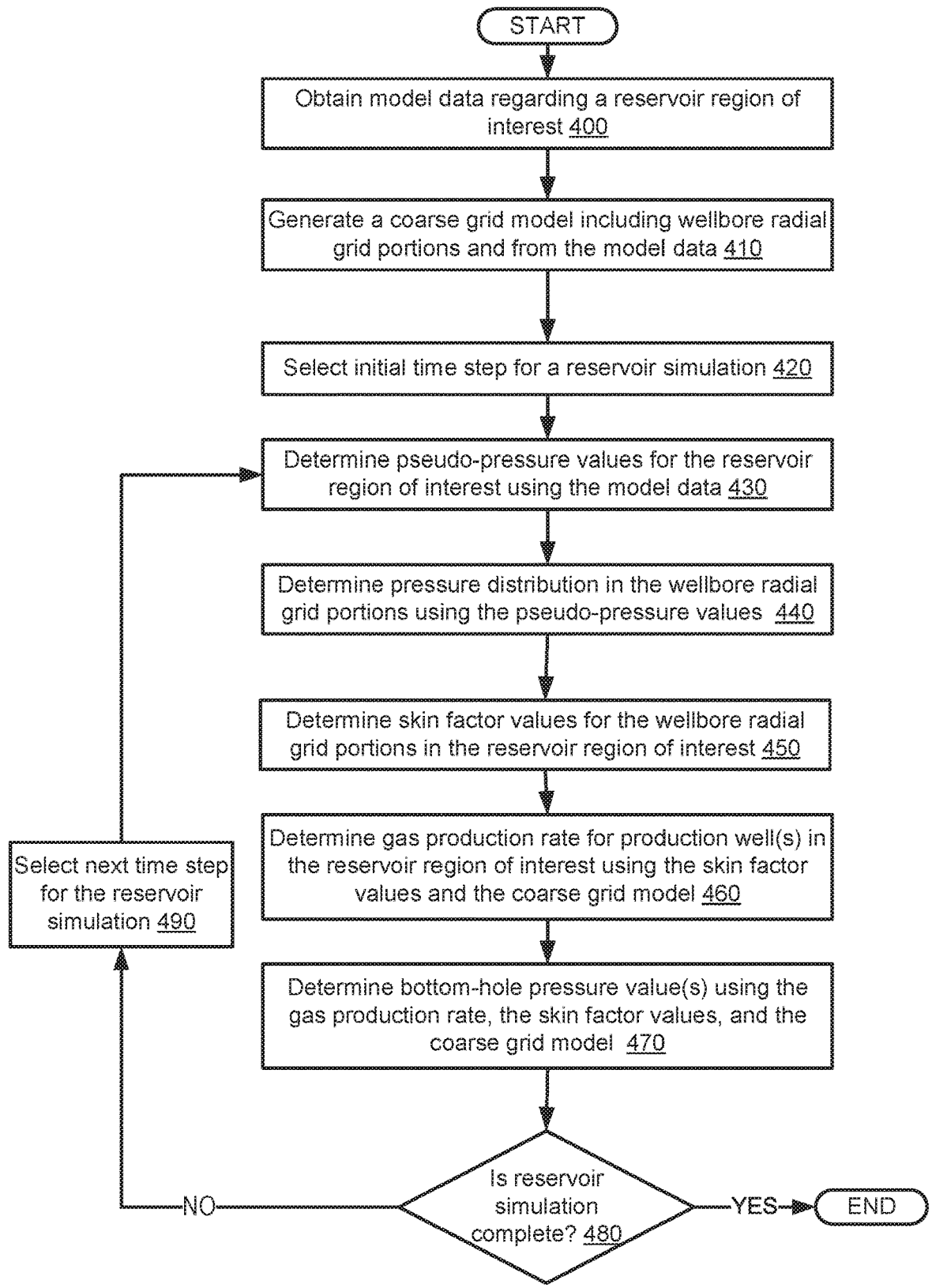
FIG. 4 shows a flowchart in accordance with one or more embodiments.

Turning to FIG. 4, FIG. 4 shows a flowchart in accordance with one or more embodiments. Specifically, FIG. 4 describes a general method for simulating a reservoir region of interest using a dynamic skin factor. One or more blocks in FIG. 4 may be performed by one or more components (e.g., reservoir simulator (160)) as described in FIGS. 1, 2B, and 3. While the various blocks in FIG. 4 are presented and described sequentially, it will be understood that some or all of the blocks may be executed in different orders, may be combined or omitted, and some or all of the blocks may be executed in parallel. Furthermore, the blocks may be performed actively or passively.

In Block 400, model data is obtained from a grid model for a reservoir region of interest in accordance with one or more embodiments. For example, a reservoir simulator may access model data in a fine-grid model, where the model data includes various reservoir property values, such as oil saturation, water saturation, porosity, permeability, etc. The reservoir region of interest may correspond to a portion of a geological region selected for running simulations and further analysis. For example, the reservoir region of interest may be similar to geological region (200) or reservoir region (230) described above in FIG. 2A and the accompanying description.

In Block 410, a coarse grid model is generated that includes wellbore radial grid portions and from model data in accordance with one or more embodiments. For example, a reservoir simulator may perform one or more logical operations on one or more selected reservoir properties within reservoir model data to generate a grid model. More specifically, the selected reservoir properties may be static grid properties coming from model data, e.g., a fine-grid model for a reservoir region of interest. Additionally, in some embodiments, the coarse grid model includes a wellbore radial grid to determine a skin factor value for one or more time steps within a reservoir simulation. For more information on using the wellbore radial grid, see Blocks 430-490 and the accompanying description below.

Figure 5:
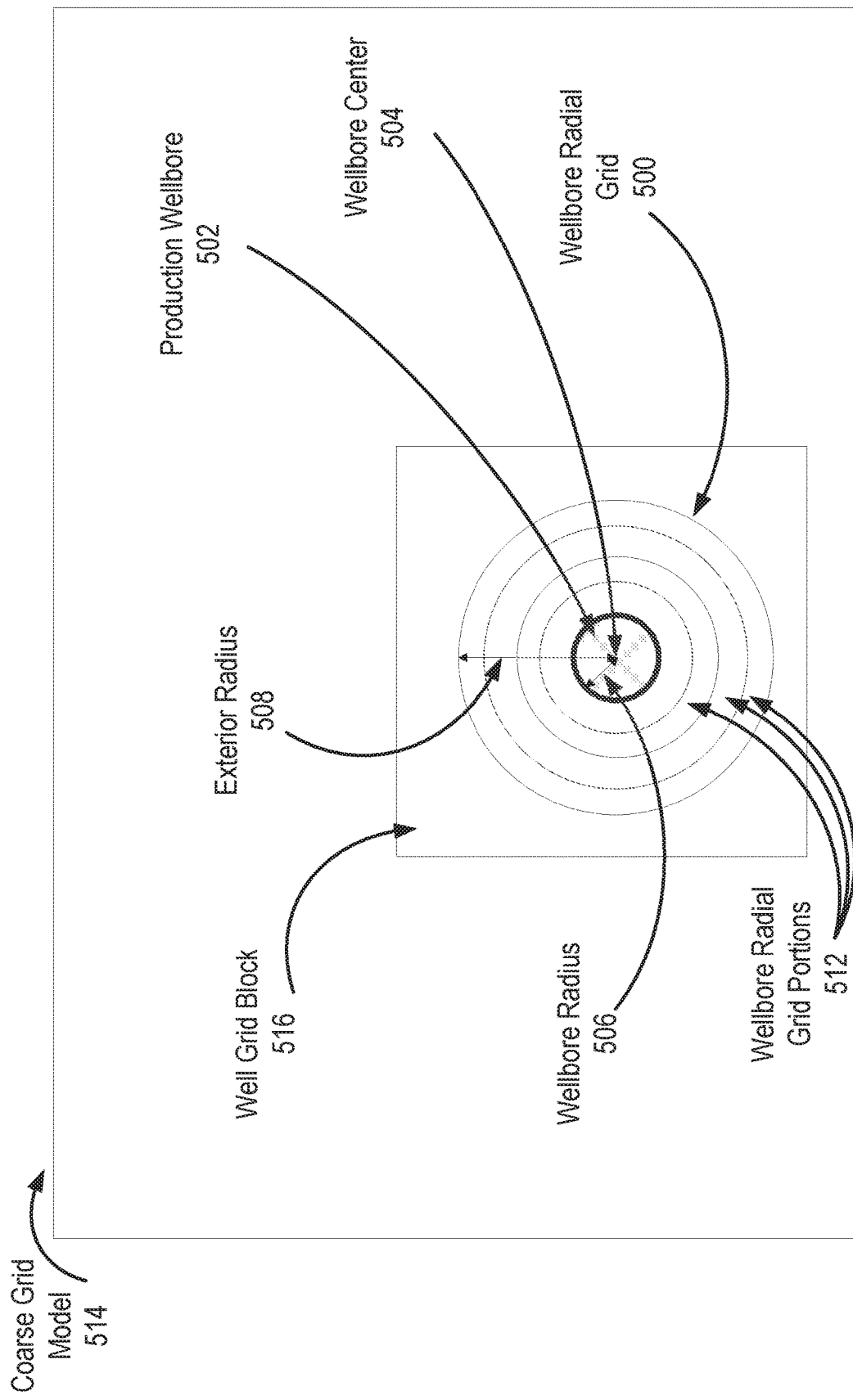
FIGS. 5 and 6 show examples in accordance with one or more embodiments.

Turning to FIG. 5, FIG. 5 shows a map view of a coarse grid model in accordance with one or more embodiments. As shown in FIG. 5, a coarse grid model (514) may be a portion of a reservoir grid model that includes a production wellbore (502) and a wellbore radial grid (500) surrounding the production wellbore (502). For example, the wellbore radial grid (500) may include various wellbore radial grid portions (512) based on different radii from a wellbore center (504). As shown, the wellbore radial grid portions (512) may be defined using various radial rings emanating from the wellbore center (504). As such, the wellbore radial grid (500) may extend from the wellbore radius (506) to an exterior radius (508) defining an exterior boundary of the wellbore radial grid (500). The wellbore radial grid (500) may be completely enclosed within the well grid block (516) of the coarse grid model (514) that contains the production wellbore (502). Thus, the reservoir pressure at the exterior boundary of the wellbore radial grid (510) may be the reservoir pressure within the well grid block (516) of the coarse grid model (514) that contains the production wellbore (502). Likewise, the coarse grid model (514) may be Cartesian with boundaries crossing one another orthogonally.

Returning to FIG. 4, in Block 420, an initial time step is selected for a reservoir simulation in accordance with one or more embodiments. For example, the initial time step may represent the moment at which oil and gas production begins in a simulation. Likewise, a reservoir simulator may select the initial time to correspond to the drilling of one or more new wells. In other embodiments, the initial time step may be chosen by a user or automatically by the reservoir simulator for any time in the life of a reservoir.

In Block 430, various pseudo-pressure values are determined for a reservoir region of interest using model data in accordance with one or more embodiments. More specifically, pseudo-pressure values may be normalized pressure values to account for gas viscosity and compressibility. For example, reservoir property data may be used to determine the pseudo-pressure values with respect to the wellbore radial grid portions. In some embodiments, the pseudo-pressure values, $\varphi(p)$, may be related to reservoir pressure, p, as expressed by the following equation:

$$\varphi(p) = \int_{p_{min}}^{p} \frac{k_{rg}(p)}{\mu_g(p)\beta_g(p)} dp \qquad \text{(Equation 1)}$$

where $k_{rg}(p)$ is the pressure dependent relative gas permeability, $\mu_g(p)$ is the pressure dependent gas viscosity, $\beta_g(p)$ is the pressure dependent gas formation factor, and $p_{min}$ is a minimum pressure that may be the reservoir pressure at the production well.

Furthermore, the variation of the pseudo-pressure values around the production well may be expressed by the following equation:

$$\frac{1}{r}\frac{\partial}{\partial r}\left\{2\pi r \Delta z \, k_r \frac{\partial \varphi}{\partial r}\right\} = 0, \qquad \text{(Equation 2a)}$$

where r is the radial distance from the production well, $\Delta z$ is the thickness of the wellbore radial grid portion that is parallel to a wellbore radial grid axis, and $k_r$ is a radial effective gas permeability. For example, the radial effective gas permeability may be a function of the product of an absolute permeability and a relative permeability to gas.

At the production well, the gas volume production rate, $q_g$, may be expressed by the following equation:

$$q_g = -2\pi r \Delta k_r \left(\frac{\partial \varphi}{\partial r}\right), \qquad \text{(Equation 2b)}$$

with boundary conditions given by the following equations:

$$\varphi_0 = \varphi(p_0), \qquad \text{(Equation 2c)}$$

$$\varphi(x,y,z,0) = \varphi\{g(x,y,z,0)\}, \qquad \text{(Equation 2d)}$$

where $\varphi_0$ is the pseudo-pressure at the exterior boundary of the wellbore radial grid, $p_0$ is the pressure at the exterior boundary, and g (x, y, z, 0) is a function from the initial model definition.

Equations 2a-2d above may be completely linear with respect to the pseudo-pressure $\varphi$, and therefore the pseudo-pressure may be calculated directly and the reservoir pressure may be calculated uniquely using the following equation:

$$p = G^{-1}(\varphi) \qquad \text{Equation (3)}$$

where G is the function that maps p to $\varphi$.

In Block 440, a pressure distribution is determined in wellbore radial grid portions using various pseudo-pressure values in accordance with one or more embodiments. For example, reservoir pressure may be calculated from the pseudo-pressure using an inverse lookup table generated from the function $G^{-1}$. In particular, an inverse lookup table may provide pre-tabulated values of reservoir pressure corresponding to different pseudo-pressure values. In some embodiments, inverse lookup tables may provide functionality for interpolating between adjacent values of pseudo-pressure to determine reservoir pressure distribution. In other embodiments the reservoir pressure may be calculated from pseudo-pressure values using a pointwise iterative inversion.

In Block 450, various skin factor values are determined for various wellbore radial grid portions in a reservoir region of interest in accordance with some embodiments. In some embodiments, for example, the skin factor for each wellbore radial grid portion may be calculated for the current time step using the following equation:

$$S_j = \left(\frac{L_{g,max}}{L_{g,j}} - 1\right)\ln\left(\frac{r_j}{r_w}\right), \qquad \text{(Equation 4a)}$$

where $r_j$ is the exterior radius of the j-th portion in a wellbore radial grid, $r_w$ is the radius of the production wellbore, and ln denotes the natural logarithm operator. $L_{g,max}$ denotes the gas mobility outside of the oil condensation zone beyond the dewpoint radius, and $L_{g,j}$ may be determined using the following equation:

$$L_{g,j} = \frac{k_{rg}(s_{g,j})}{\mu_g(p_j)\beta_g(p_j)}, \qquad \text{(Equation 4b)}$$

where $k_{rg}(p_j)$, $\mu(p_j)$, and $\beta_g(p_j)$ is the pressure dependent relative gas permeability, the pressure dependent gas viscosity, and the pressure dependent gas formation factor, respectively, for reservoir pressures corresponding to the j-th portion in a wellbore radial grid.

Further, in some embodiments, the skin factor for the production well may be calculated for the current time step using the following equation:

$$S = \left(\frac{L_{g,max}}{L_{g,H}} - 1\right)\ln\left(\frac{r_o}{r_w}\right),\qquad \text{(Equation 4c)}$$

where $r_0$ is the exterior radius of a wellbore radial grid (e.g., exterior radius (508) of FIG. 5), and $L_{g,H}$ denotes the harmonic average of the gas mobility over each of the portions in the wellbore radial grid. In some embodiments, $L_{g,H}$ may be determined using the following equation:

$$L_{g,H} = \frac{\ln\left(\frac{r_o}{r_w}\right)}{\sum_{j=1}^{N}\ln\left(\frac{r_{e,j}}{r_{w,j}}\right)/L_{g,j}}\qquad \text{(Equation 4d)}$$

where $r_{e,j}$ and $r_{w,j}$ denotes the east and west radii of the j-th portion in the wellbore radial grid, respectively.

In Block 460, a gas production rate is determined for one or more production wells in a reservoir region of interest using various skin factor values and a coarse grid model in accordance with one or more embodiments. For example, the gas production rate, $q_g$, for a production well may be determined using the following equation:

$$q_g = 2\pi\Delta z k\left(\frac{\varphi_o - \varphi_w}{\ln\left(\frac{r_o}{r_w}\right) + S}\right)\qquad \text{(Equation 4)}$$

where k is the effective gas permeability, S is the skin factor value, $\omega$, is the pseudo-pressure value of water, and $\varphi_0$ is the pseudo-pressure value of oil. In particular, relative permeability $k_r$ may be used if multi-fluid phases (e.g., oil and gas) are flowing simultaneously. Therefore, this multi-fluid phase flow may be expressed according to a relative permeability to gas in the equations. Thus, where oil is immobile and hence the relative permeability to gas equals a value of '1' (i.e., $k_r=1$), k in the equations may reflect the "effective gas permeability."

In Block 470, one or more bottom-hole pressure values are determined using a gas production rate, various skin factor values, and a coarse grid model in accordance with one or more embodiments. For example, a flowing bottom-hole pressure value, $p_{wf}$, may be determined using the following equation:

$$p_{wf} = p_0 - \frac{q_g}{PI}\qquad \text{(Equation 6)}$$

where PI is a well productivity index that may be defined as the volume of gas produced per unit of pressure reduction. In some embodiments, for example, a well productivity index may be determined using the following equation:

$$PI = \frac{L_g(s_g)}{\beta_g(p_w)}\frac{2\pi\Delta z k}{\ln\left(\frac{r_o}{r_w}\right) + S}\qquad \text{(Equation 7)}$$

where $s_g$ and $p_w$ are the gas saturation and the reservoir pressure, respectively, in the innermost portion of the wellbore radial grid.

In Block 480, a determination is made whether a reservoir simulation is complete in accordance with one or more embodiments. For example, a reservoir simulator may determine a particular simulation has reached the final time step. Where a determination is made that the reservoir simulation has one or more time steps remaining, the process shown in FIG. 4 may proceed to Block 490. Where a determination is made that no time steps remain to determine for the reservoir simulation, the process shown in FIG. 4 may end.

In Block 490, a time step is selected next for a reservoir simulation in accordance with one or more embodiments. For example, a reservoir simulator may increment a time variable within a reservoir simulation based on a predetermined increment size. Accordingly, the process in FIG. 4 may iteratively return to Blocks 430-480 to update one or more variables during the simulation process, e.g., skin factor values, pseud-pressure values, gas production rates, bottom-hole pressure values, etc., for different time steps within a reservoir simulation.

Figure 6:
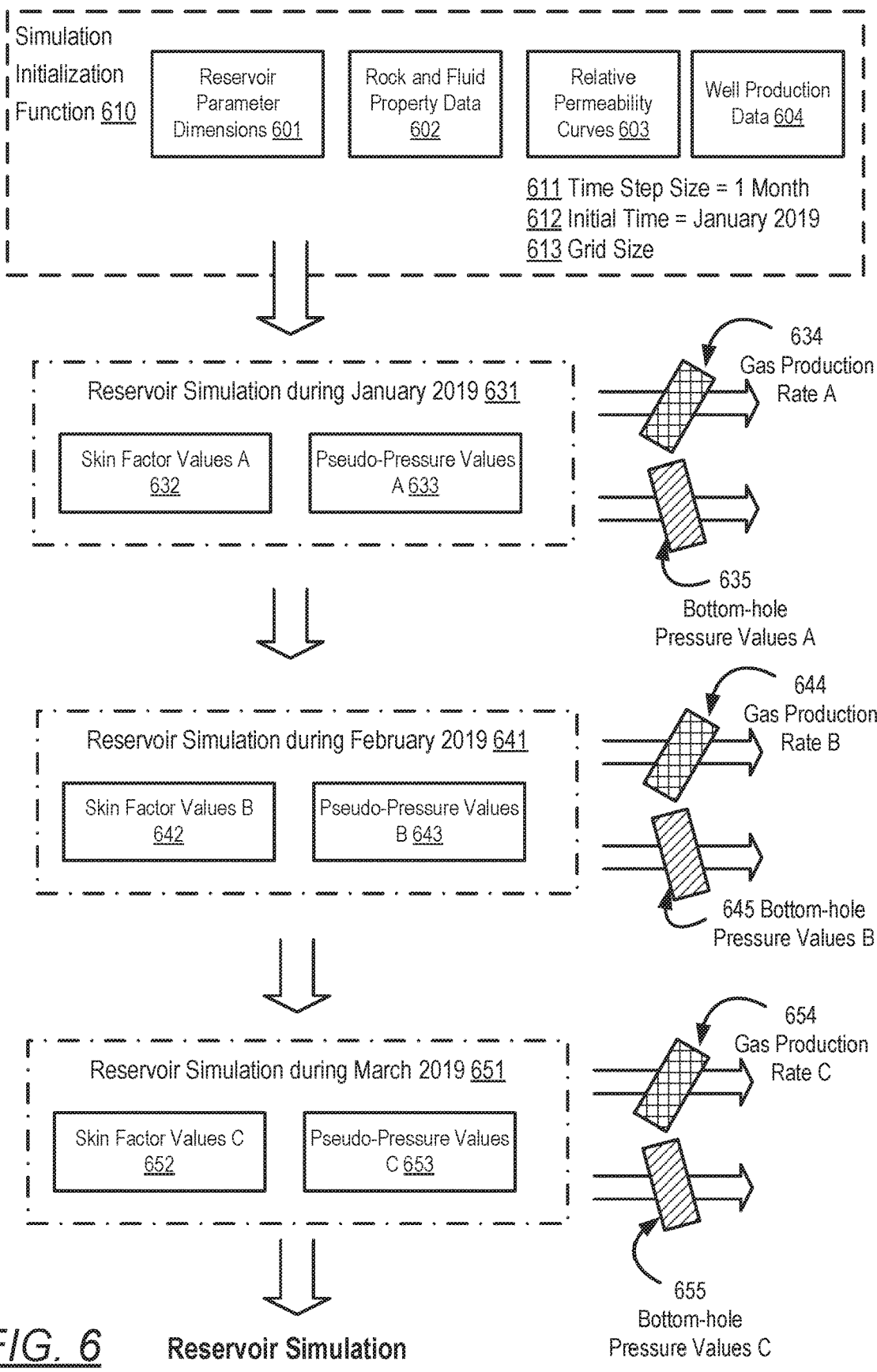

Turning to FIG. 6, FIG. 6 provides an example of performing a reservoir simulation in accordance with one or more embodiments. The following example is for explanatory purposes only and not intended to limit the scope of the disclosed technology. FIG. 6 shows a reservoir simulator that uses a simulation initialization function (610) to prepare a reservoir simulation for a particular reservoir region of interest. As shown in FIG. 6, the simulation initialization function (610) uses reservoir parameter dimensions (601) (e.g., to define a reservoir region of interest), rock and fluid property data (602), relative permeability curves (603), and well production data (604) as inputs for a reservoir simulation. Likewise, the reservoir simulator also specifies various simulation parameters, such as a time step size (611), an initial time (612) of the reservoir simulation, and a grid size (613), for executing the reservoir simulation.

Keeping with FIG. 6, the reservoir simulator determines multiple simulation values at the initial time (612). Here, as January 2019 is the initial time (612) for the reservoir simulation, the reservoir simulator determines skin factor values A (632) and pseudo-pressure values A (633) for the reservoir simulation during January 2019 (631). Accordingly, based on these values (632, 633) as well as model data, the reservoir simulation outputs a gas production rate A (634) and bottom-hole pressure values A (635) for the reservoir simulation during January 2019 (631). Afterwards, the reservoir simulator proceeds to increment the simulation time to the next time step, i.e., at February 2019. At the reservoir simulation during February 2019 (641), the reservoir simulator again determines skin factor values (i.e., skin factor values B (642)) and pseudo-pressure values (i.e., pseudo-pressure values B (643)) in order to determine a gas production rate B (644) and bottom-hole pressure values B (645). After updating the time step, the reservoir simulator at the reservoir simulation during March 2019 (651) determines the next skin factor values (i.e., skin factor values C (652)) and the next pseudo-pressure values (i.e., pseudo-pressure values C (653)) in order to determine a gas production rate C (654) and bottom-hole pressure values C (655). Finally, the reservoir simulation ends (690).

Figure 7:
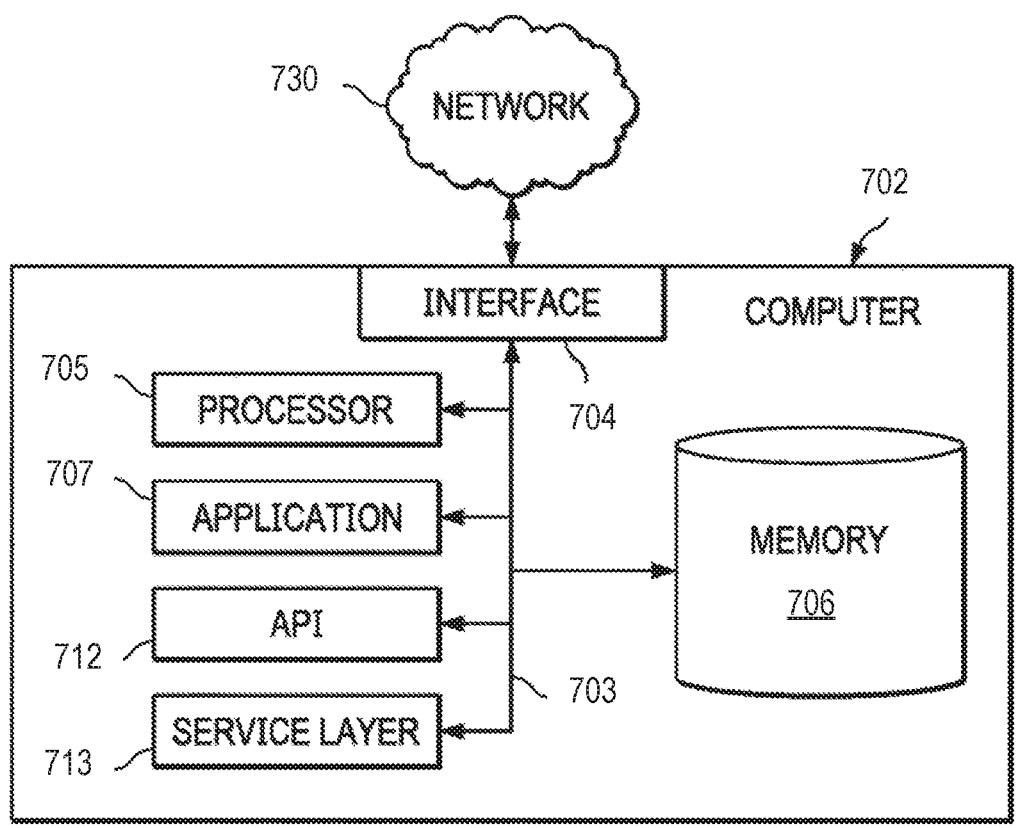
FIG. 7 shows a computer system in accordance with one or more embodiments.

Embodiments may be implemented on a computer system. FIG. 7 is a block diagram of a computer system (702) used to provide computational functionalities associated with described algorithms, methods, functions, processes, flows, and procedures as described in the instant disclosure, according to an implementation. The illustrated computer (702) is intended to encompass any computing device such as a high performance computing (HPC) device, server, desktop computer, laptop, notebook computer, wireless data port, smart phone, personal data assistant (PDA), tablet computing device, one or more processors within these devices, or any other suitable processing device, including both physical or virtual instances (or both) of the computing device. Additionally, the computer (702) may include a computer that includes an input device, such as a keypad, keyboard, touch screen, or other device that can accept user information, and an output device that conveys information associated with the operation of the computer (702), including digital data, visual, or audio information (or a combination of information), or a GUI.

The computer (702) can serve in a role as a client, network component, a server, a database or other persistency, or any other component (or a combination of roles) of a computer system for performing the subject matter described in the instant disclosure. The illustrated computer (702) is communicably coupled with a network (730). In some implementations, one or more components of the computer (702) may be configured to operate within environments, including cloud-computing-based, local, global, or other environment (or a combination of environments).

At a high level, the computer (702) is an electronic computing device operable to receive, transmit, process, store, or manage data and information associated with the described subject matter. According to some implementations, the computer (702) may also include or be communicably coupled with an application server, e-mail server, web server, caching server, streaming data server, business intelligence (BI) server, or other server (or a combination of servers).

The computer (702) can receive requests over network (730) from a client application (for example, executing on another computer (702)) and responding to the received requests by processing the said requests in an appropriate software application. In addition, requests may also be sent to the computer (702) from internal users (for example, from a command console or by other appropriate access method), external or third-parties, other automated applications, as well as any other appropriate entities, individuals, systems, or computers.

Each of the components of the computer (702) can communicate using a system bus (703). In some implementations, any or all of the components of the computer (702), both hardware or software (or a combination of hardware and software), may interface with each other or the interface (704) (or a combination of both) over the system bus (703) using an application programming interface (API) (712) or a service layer (713) (or a combination of the API (712) and service layer (713). The API (712) may include specifications for routines, data structures, and object classes. The API (712) may be either computer-language independent or dependent and refer to a complete interface, a single function, or even a set of APIs. The service layer (713) provides software services to the computer (702) or other components (whether or not illustrated) that are communicably coupled to the computer (702). The functionality of the computer (702) may be accessible for all service consumers using this service layer. Software services, such as those provided by the service layer (713), provide reusable, defined business functionalities through a defined interface. For example, the interface may be software written in JAVA, C++, or other suitable language providing data in extensible markup language (XML) format or other suitable format. While illustrated as an integrated component of the computer (702), alternative implementations may illustrate the API (712) or the service layer (713) as stand-alone components in relation to other components of the computer (702) or other components (whether or not illustrated) that are communicably coupled to the computer (702). Moreover, any or all parts of the API (712) or the service layer (713) may be implemented as child or sub-modules of another software module, enterprise application, or hardware module without departing from the scope of this disclosure.

The computer (702) includes an interface (704). Although illustrated as a single interface (704) in FIG. 7, two or more interfaces (704) may be used according to particular needs, desires, or particular implementations of the computer (702). The interface (704) is used by the computer (702) for communicating with other systems in a distributed environment that are connected to the network (730). Generally, the interface (704 includes logic encoded in software or hardware (or a combination of software and hardware) and operable to communicate with the network (730). More specifically, the interface (704) may include software supporting one or more communication protocols associated with communications such that the network (730) or interface's hardware is operable to communicate physical signals within and outside of the illustrated computer (702).

The computer (702) includes at least one computer processor (705). Although illustrated as a single computer processor (705) in FIG. 7, two or more processors may be used according to particular needs, desires, or particular implementations of the computer (702). Generally, the computer processor (705) executes instructions and manipulates data to perform the operations of the computer (702) and any algorithms, methods, functions, processes, flows, and procedures as described in the instant disclosure.

The computer (702) also includes a memory (706) that holds data for the computer (702) or other components (or a combination of both) that can be connected to the network (730). For example, memory (706) can be a database storing data consistent with this disclosure. Although illustrated as a single memory (706) in FIG. 7, two or more memories may be used according to particular needs, desires, or particular implementations of the computer (702) and the described functionality. While memory (706) is illustrated as an integral component of the computer (702), in alternative implementations, memory (706) can be external to the computer (702).

The application (707) is an algorithmic software engine providing functionality according to particular needs, desires, or particular implementations of the computer (702), particularly with respect to functionality described in this disclosure. For example, application (707) can serve as one or more components, modules, applications, etc. Further, although illustrated as a single application (707), the application (707) may be implemented as multiple applications (707) on the computer (702). In addition, although illustrated as integral to the computer (702), in alternative implementations, the application (707) can be external to the computer (702).

There may be any number of computers (702) associated with, or external to, a computer system containing computer (702), each computer (702) communicating over network (730). Further, the term "client," "user," and other appropriate terminology may be used interchangeably as appropriate without departing from the scope of this disclosure. Moreover, this disclosure contemplates that many users may use one computer (702), or that one user may use multiple computers (702).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, any means-plus-function clauses are intended to cover the structures described herein as performing the recited function(s) and equivalents of those structures. Similarly, any step-plus-function clauses in the claims are intended to cover the acts described here as performing the recited function(s) and equivalents of those acts. It is the express intention of the applicant not to invoke 35 U.S.C. § 112(f) for any limitations of any of the claims herein, except for those in which the claim expressly uses the words "means for" or "step for" together with an associated function.

What is claimed:

1. A method, comprising:
    obtaining, by a reservoir simulator, a coarse grid model comprising a plurality of wellbore radial grid portions and model data for a reservoir region of interest;
    obtaining, by the reservoir simulator, reservoir pressure data from a plurality of pressure sensors and a plurality of flowrate sensors coupled to one or more wells penetrating the reservoir region of interest;
    obtaining, by the reservoir simulator, multi-fluid phase data from the plurality of flow rate sensors for gas production from one or more wellheads among the one or more wells;
    determining, by the reservoir simulator, a plurality of time steps for a reservoir simulation of the reservoir region of interest, wherein the plurality of time steps comprise a first time step and a second time step;
    determining, by the reservoir simulator and for the first time step within an iterative simulation process, a plurality of first pseudo-pressure values based on the model data and the reservoir pressure data;
    determining, by the reservoir simulator and for the first time step, a plurality of first dynamic skin factor values for the plurality of wellbore radial grid portions using the plurality of first pseudo-pressure values and the multi-fluid phase data, wherein the plurality of first dynamic skin factor values corresponds to gas mobility within the reservoir region of interest, and wherein first dynamic skin factor values among the plurality of first dynamic skin factor values differ based on a radial distance from a production well within the reservoir region of interest;
    predicting, by the reservoir simulator and for the first time step, a first well production rate for the production well using the plurality of first dynamic skin factor values and a first pressure distribution for the reservoir region of interest;
    determining, by the reservoir simulator and for the second time step within the iterative simulation process, a plurality of second pseudo-pressure values based on the first well production rate;
    determining, by the reservoir simulator and for the second time step, a plurality of second dynamic skin factor values for the plurality of wellbore radial grid portions using the plurality of second pseudo-pressure values, wherein the plurality of second dynamic skin factor values is different from the plurality of first dynamic skin factor values; and
    predicting for the second time step within the iterative simulation process, a second well production rate using the plurality of second dynamic skin factor values and a second pressure distribution for the reservoir region of interest.

2. The method of claim 1, further comprising determining, for the first time step and using the first well production rate and a well productivity index, a bottom-hole pressure value in the reservoir region of interest.

3. The method of claim 1, further comprising:
    obtaining pressure data regarding at least one of the plurality of wellbore radial grid portions; and
    determining, using an inverse lookup table and the pressure data, a pseudo-pressure value.

4. The method of claim 1, wherein the plurality of first dynamic skin factor values is based on gas mobility values outside an oil condensation zone in the reservoir region of interest and a harmonic average of gas mobility values within the plurality of wellbore radial grid portions.

5. The method of claim 1, wherein the plurality of wellbore radial grid portions corresponds to a plurality of radial rings emanating from a center disposed in a wellbore of the production well.

6. The method of claim 1, wherein the plurality of first pseudo-pressure values corresponds to pressure data that is normalized based on gas viscosity and gas compressibility.

7. The method of claim 1, wherein the well is a natural-gas condensate well, and wherein the model data correspond to a plurality of rock properties, a plurality of fluid properties, and a plurality of relative permeability values within the reservoir region of interest.

8. A system, comprising:
    a wellhead of a well penetrating a reservoir region of interest;
    a plurality of pressure sensors and a plurality of flow rate sensors coupled to the wellhead; and
    a reservoir simulator comprising a computer processor, and coupled to the plurality of pressure sensors and the plurality of flow rate sensors, wherein the reservoir simulator comprises functionality for:
        obtaining a coarse grid model comprising a plurality of wellbore radial grid portions and model data for the reservoir region of interest;
        obtaining reservoir pressure data from the plurality of pressure sensors and the plurality of flowrate sensors;
        obtaining multi-fluid phase data from the plurality of flow rate sensors for gas production from the wellhead;
        determining a plurality of time steps for a reservoir simulation of the reservoir region of interest, wherein the plurality of time steps comprise a first time step and a second time step;
        determining, for the first time step within an iterative simulation process, a plurality of first pseudo-pressure values based on the model data and the reservoir pressure data;
        determining, for the first time step, a plurality of first dynamic skin factor values for the plurality of wellbore radial grid portions using the plurality of first pseudo-pressure values and the multi-fluid phase data, wherein the plurality of first dynamic skin factor values corresponds to gas mobility within the reservoir region of interest, and wherein first dynamic skin factor values among the plurality of first dynamic skin factor values differ based on a radial distance from a production well within the reservoir region of interest;

predicting, for the first time step, a first well production rate for the production well using the plurality of first dynamic skin factor values and a first pressure distribution for the reservoir region of interest;

determining, for the second time step within the iterative simulation process, a plurality of second pseudo-pressure values based on the first well production rate;

determining, for the second time step, a plurality of second dynamic skin factor values for the plurality of wellbore radial grid portions using the plurality of second pseudo-pressure values, wherein the plurality of second dynamic skin factor values is different from the plurality of first dynamic skin factor values; and predicting for the second time step within the iterative simulation process, a second well production rate using the plurality of second dynamic skin factor values and a second pressure distribution for the reservoir region of interest.

9. The system of claim 8, wherein the reservoir simulator further comprises functionality for:

obtaining pressure data regarding at least one of the plurality of wellbore radial grid portions; and determining, using an inverse lookup table and the pressure data, a pseudo-pressure value.

10. The system of claim 8, wherein the reservoir simulator further comprises functionality for determining the plurality of first dynamic skin factor values based on gas mobility values outside an oil condensation zone in the reservoir region of interest and a harmonic average of gas mobility values within the plurality of wellbore radial grid portions.

11. The system of claim 8, wherein the reservoir simulator further comprises functionality for determining the plurality of wellbore radial grid portions corresponding to a plurality of radial rings emanating from a center disposed in a wellbore of the production well.

12. The system of claim 8, wherein the reservoir simulator further comprises functionality for determining the plurality of pseudo-pressure values corresponding to pressure data that is normalized based on gas viscosity and gas compressibility.

13. The system of claim 8, wherein the well is a natural-gas condensate well, and wherein the model data correspond to a plurality of rock properties, a plurality of fluid properties, and a plurality of relative permeability values within the reservoir region of interest.

\* \* \* \* \*